United States Patent [19]

Okumura

[11] 4,015,191
[45] Mar. 29, 1977

[54] D.C. HIGH VOLTAGE POWER SOURCE WITH PRECISE LOAD CURRENT MEASUREMENT

[75] Inventor: Masahide Okumura, Hachioji, Japan
[73] Assignee: Hitachi, Ltd., Japan
[22] Filed: Feb. 9, 1976
[21] Appl. No.: 656,435
[30] Foreign Application Priority Data
  Feb. 14, 1975  Japan ............... 50-17293
[52] U.S. Cl. .................... 323/16; 324/71 EB; 324/76 R
[51] Int. Cl.² .......................................... G05F 1/46
[58] Field of Search ........... 323/1, 16, 9, 19, 100, 323/22 T; 324/74, 76, 77, 71 EB, 130; 321/15

[56] References Cited
UNITED STATES PATENTS

| | | | |
|---|---|---|---|
| 3,775,664 | 11/1973 | Forstmeyer | 321/15 |
| 3,784,909 | 1/1974 | Schutt et al. | 324/71 EB |
| 3,810,014 | 5/1974 | Goldner | 324/130 |
| 3,815,015 | 6/1974 | Swin et al. | 323/22 T |

Primary Examiner—Gerald Goldberg
Attorney, Agent, or Firm—Craig & Antonelli

[57] ABSTRACT

A d.c. high voltage power source comprising: a d.c. high voltage generator; a voltage divider for detecting an output voltage of said generator, which is connected between the high voltage output terminal of said generator and ground potential; an error amplifier, one input terminal of said error amplifier being connected to the voltage dividing point of said voltage divider; a reference voltage source connected between the other input terminal of said error amplifier and ground potential; control means for stabilizing said output voltage of said generator by the output of said error amplifier so as to maintain said output of said error amplifier substantially equal to zero; an ammeter connected between the low voltage output terminal of said generator and ground potential; a resistor connected between the non-grounded terminal of said reference voltage source and said low voltage output terminal of said generator, the resistance value of said resistor being equal to that of the resistance to ground of said voltage dividing point of said voltage divider.

10 Claims, 4 Drawing Figures

D.C. HIGH VOLTAGE POWER SOURCE WITH PRECISE LOAD CURRENT MEASUREMENT

BACKGROUND OF THE INVENTION

1. Field of the Invention

This invention relates to improvements in a stabilized d.c. high voltage power source, and more particularly to improvements in a system for measuring a load current of such power source.

2. Description of the Prior Art

A d.c. high voltage power source is required for accelerating charged particles in, for example, apparatus utilizing a high energy electron beam, such as an electron microscope, an X-ray tube and an electron accelerator, as well as apparatus utilizing a high energy ion beam, such as an ion microscope, an ion microanalyzer, and an ion accelerator (hereinbelow, such devices shall be generically referred to as charged particle beam-applying apparatus).

In the charged particle beam-applying apparatus of this type, it is necessary to maintain a high stability in the acceleration energy of the charged particle beam employed. As the power source for accelerating the charged particles, therefore, a d.c. high voltage power source whose output voltage is highly stabilized need be used. To this end, a system is usually adopted in which a voltage divider for detecting the output voltage is connected across the high voltage output terminals of the power source and in parallel with a load. Then, the detected voltage at a voltage dividing point on the voltage divider is compared with a reference voltage, and an input of the power source is subjected to negative feedback control so as to reduce the measured difference between the dividing point voltage and the reference voltage to zero.

In the charged particle beam-applying apparatus of the specified type, it is also necessary to precisely know the current value of the charged particle beam which is utilized. It is, accordingly, required to measure and monitor the emission current from the charged particle source (namely, the load current of the d.c. high voltage power source) by some suitable method.

In principle, the load current of the high voltage power source can be determined by connecting an ammeter in series between the power source and the load and directly reading an indication thereof. However, where the output voltage value of the power source is so large as to be dangerous to the human body, it is undesirable from the viewpoint of both safety and actual installation to insert the ammeter on the high voltage side of the load.

In the charged particle beam-applying apparatus of the type described, the vacuum airtight casing thereof in which the charged particle beam (load current) flows is generally connected directly to ground. It is therefore impossible to connect the ammeter on the low voltage side of the load.

For these reasons, it has heretofore been common practice in the art to adopt a system in which, as illustrated in FIG. 1, the high voltage generating portion of the power source is connected to float above ground potential and the ammeter (or any other current measuring instrument as desired) is connected between the low voltage side output terminal and ground potential.

FIG. 1 shows an example of a prior art stabilized d.c. high voltage power source of this type. In the figure a d.c. high voltage generator 1 comprises a controlled input portion 2, an insulating transformer 3, and a voltage doubler circuit 4. The controlled input portion 2 may be provided in the form of an oscillator which is subjected to amplitude control in the well-known manner by an output of an error amplifier 7. The output of the controlled oscillator is boosted by the insulating transformer 3 and then converted into a d.c. high voltage by the voltage doubler circuit 4.

The negative high voltage $V_H$ which appears at the high voltage side output terminal 5 of the generator 1 is impressed on an electron source 9 of an electron beam-applying apparatus 8, such as a scanning electron microscope. As the result, an electron beam $e$ is emitted from the electron source 9, and an emission current (load current) $I_e$ flows from the target of the device proportional to the beam current thereof. The low voltage side output terminal 6 of the high voltage generator 1 is grounded through an ammeter 10. Accordingly, the emission current $I_e$ flows to the ground potential via the ammeter 10.

On the other hand, voltage dividing resistances 12 and 13 forming a voltage divider for detecting the output voltage of the generator are connected in parallel with the load 8 between the output terminal 5 of the high voltage generator 1 and ground potential. A bias current $I_b$ flowing through the voltage dividing resistances 12 and 13 flows to ground via the ammeter 10 similar to the emission current $I_e$.

In consequence of the flow of the bias current $I_b$ through the voltage dividing resistors 12 and 13, the following voltage appears at a voltage dividing point P:

$$V_p = R_2 \cdot I_b = \frac{R_2}{R_1 + R_2} \cdot V_H$$

where $R_1$ and $R_2$ denote the resistance values of the voltage dividing resistors 12 and 13, respectively. This voltage $V_p$ is applied to one input terminal of the error amplifier 7. To the other input terminal of the error amplifier 7, a reference voltage $V_s$ is applied by a reference voltage source 11. The error amplifier 7 amplifies the difference $V_p - V_s$ between the respective input voltages and provides the amplified voltage as an output, by which the output voltage of the high voltage generator 1 is controlled and stabilized. That is, the output amplitude of the oscillator is controlled by the output of the error amplifier 7 in the controlled input portion 2, with the result that the output voltage $V_H$ of the high voltage generator 1 is subjected to negative feedback control so as to establish $V_p = V_s$. Thus, the output voltage $V_H$ of the high voltage generator is always stably maintained at a value of:

$$V_H = \frac{R_1 + R_2}{R_2} \cdot V_s$$

Needless to say, the value of the output voltage $V_H$ can be varied by changing the value $V_s$ of the reference source voltage.

As apparent from the above explanation, the emission current $I_e$ and the bias current $I_b$ superposedly flow through the ammeter 10, so that the indication of the ammeter 10 becomes $I_e + I_b$. The value of the emission current $I_e$ as the true load current cannot therefore be known merely by directly reading the indication of the ammeter 10. In order to know the value of the emission current $I_e$ in the circuit arrangement of FIG. 1, accordingly, it is required that a calibration curve of the bias current $I_b$ corresponding to the magnitude of the output voltage $V_H$ be prepared in advance and that the value of the bias current $I_b$ evaluated from the calibration curve be subtracted from the indication $I_e + I_b$ of the ammeter 10. However, this method merely provides an approximation of the true value of $I_e$, at best. Thus, the prior art circuit arrangement shown in FIG. 1 is undesirable, since it does not provide the possibility of directly reading the true value of the load current $I_e$ of the high voltage power source, in addition to the fact that the load current indication deduced therefrom has a low measurement precision.

SUMMARY OF THE INVENTION

This invention has been made in order to eliminate the disadvantages of such prior art apparatus, as discussed above, and has for its object to provide a stabilized d.c. high voltage power source in which a true load current can be measured directly with high precision.

In order to accomplish this object, the present invention adopts a system in which, by making use of the reference voltage source normally provided for stabilizing the output voltage of the high voltage generator to produce a correcting current to cancel the bias current component $I_b$ flowing through the current measuring instrument connected to the low voltage side output terminal of the high voltage generator, the instrument will directly read the value of the load current $I_e$.

In accordance with the above-described system in accordance with this invention, only the true load current flows through the current measuring instrument at all times, so that the value of the true load current can be easily and accurately determined by directly reading an indication thereof on the instrument.

Other objects, features, and functional effects of this invention will become more apparent from the following detailed description of several exemplary embodiments of the present invention.

DESCRIPTION OF THE PREFERRED EMBODIMENTS

Figure 1:
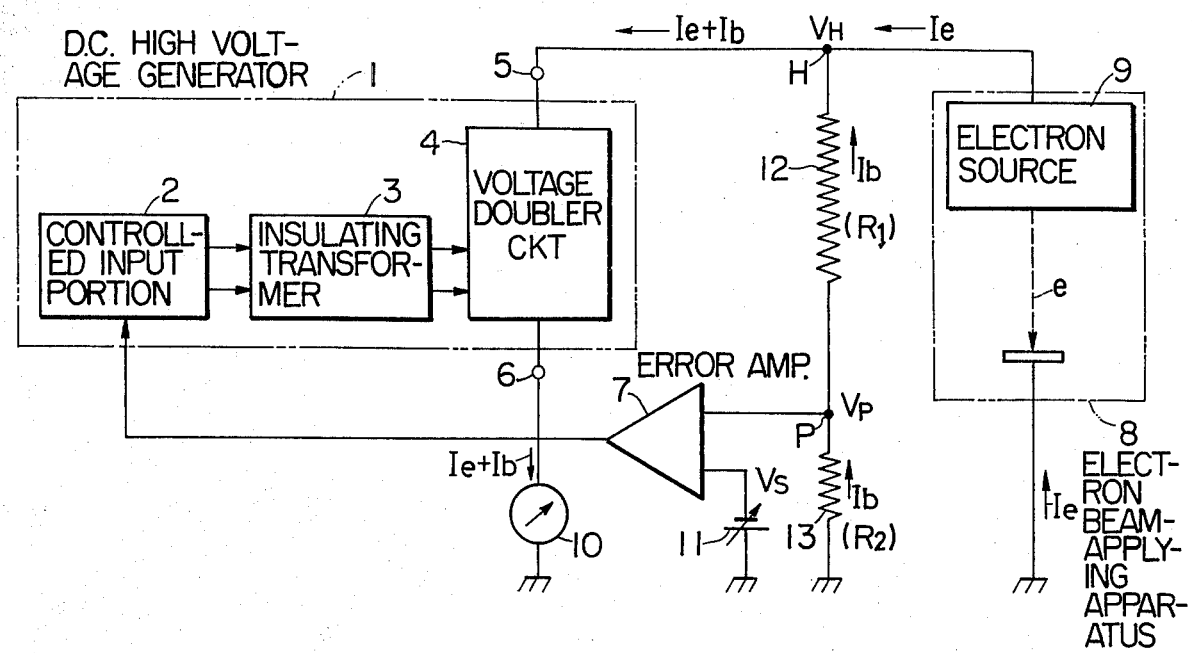
FIG. 1 is a schematic circuit diagram showing an example of the circuit arrangement of a prior art stabilized d.c. power source.
Figure 2:
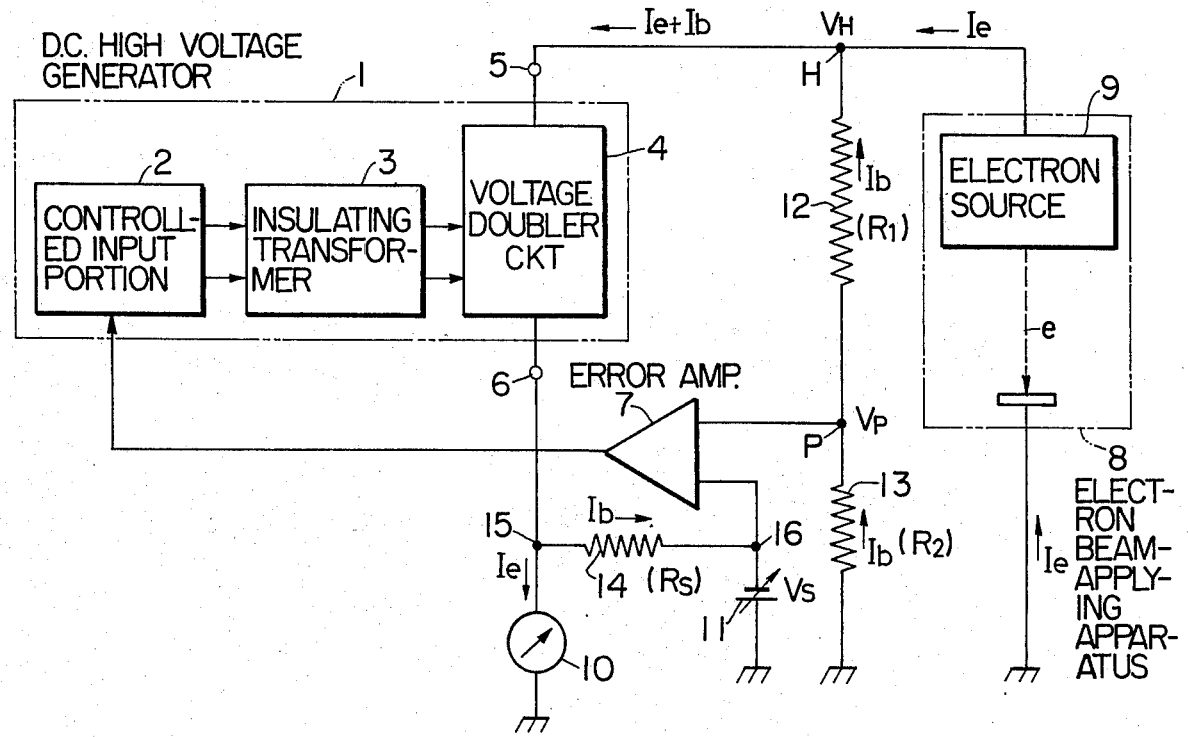
FIG. 2 is a schematic circuit diagram showing the circuit arrangement of a stabilized d.c. power source according to an embodiment of this invention.

FIG. 2 shows the circuit arrangement of a stabilized d.c. high voltage power source according to an embodiment of this invention. In the figure the construction and operation of the high voltage generator 1 and the associated circuit portions for the stabilizing control of its output voltage $V_H$ are quite the same as in the case of the prior art circuit shown in FIG. 1. More specifically, the magnitude of a bias current $I_b$ which flows through voltage dividing resistances 12 and 13 connected between the high voltage side output terminal 5 of the high voltage generator 1 and ground potential is $V_p/R_2$ (where $V_p$ denotes the voltage of a voltage dividing point P and $R_2$ the resistance value of the resistor 13). If the loop gain of the negative feedback circuit for the voltage stabilization is sufficiently high, $V_p = V_s$ will hold because the output voltage $V_H$ of the high voltage generator 1 is controlled so that the voltage $V_p$ of the voltage dividing point and the voltage $V_s$ of a reference voltage source 11 are equal. Accordingly, the magnitude of the bias current $I_b$ is also equal to $V_s/R_2$.

Thus, when the output terminal 16 of the reference voltage source 11 having the output voltage $V_s$ is connected to a terminal 15 of a current measuring instrument such as an ammeter 10 through a resistor 14 having a resistance value $R_s$ ($R_s = R_2$) as illustrated in FIG. 2, a correcting current which just equals the value of the bias current $I_b$ is diverted from the ammeter 10 and flows through the resistor 14, with the result that the ammeter 10 indicates only the value of the emission current $I_e$, the true load current. Herein, in order to attain a good measuring precision, the value of the internal resistance of the ammeter 10 should be set to be sufficiently smaller than the resistance value $R_s$ of the resistor 14.

Since the correcting current flowing through the resistance 14 differs from the true bias current flowing through the voltage dividing resistors 12 and 13, the stability of the output voltage $V_H$ of the high voltage generator 1 is not affected at all even when, for example, the internal resistance of the ammeter 10 varies due to a temperature change, etc. Since the other terminal of the reference voltage source 11 lies at the ground potential, the reference voltage source 11 can also be used for any other purpose. Further, since the other terminal of the reference voltage source 11 lies at the ground potential which is electrically the most stable, the reliability of the reference voltage source is high.

In this way, according to the embodiment of FIG. 2, the true load current can be determined with high precision merely by directly reading the indication of the ammeter 10. Moreover, the construction is a very simple one in which merely the resistor 14 is added to the prior art circuit, so that no substantial increase in the cost of the apparatus is encountered.

Figure 3:
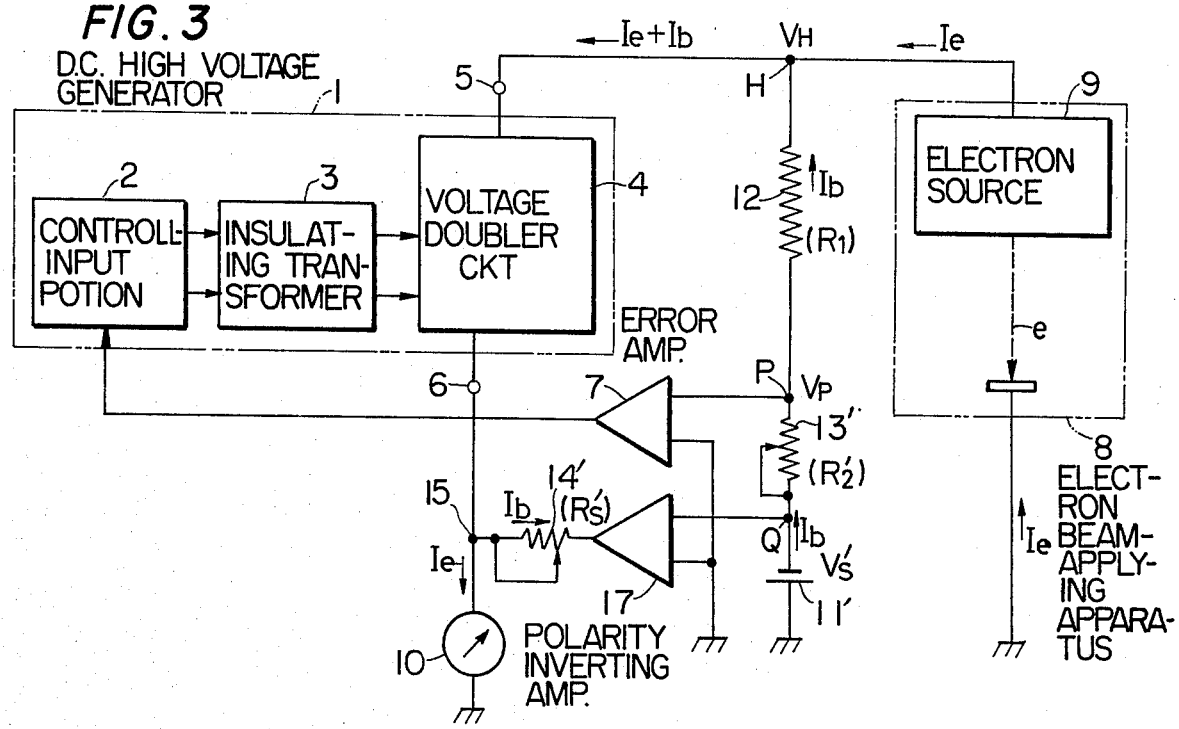
FIG. 3 is a schematic circuit diagram showing the circuit arrangement of a stabilized d.c. power source according to another embodiment of this invention.

FIG. 3 shows another embodiment of this invention. This embodiment adopts a system in which the output voltage $V_s'$ of a reference voltage source 11' is held at a constant value and the resistance value $R_2'$ of a voltage dividing resistance 13' is varied, whereby the bias current $I_b$ is varied to vary the magnitude of the output voltage $V_H$ of the high voltage generator 1.

In FIG. 3 if the loop gain of the negative feedback circuit for the stabilizing control of the output $V_H$ of the high voltage generator 1 is sufficiently high, the voltage $V_p$ of the voltage dividing point P between the voltage dividing resistances 12 and 13' will becomes substantially zero. Under this state, the magnitude of the bias current $I_b$ flowing through the voltage dividing resistors 12 and 13' is $V_s'/R_2'$, so that the output voltage $V_H$ of the high voltage generator 1 is stably kept at a value of:

$$V_H = \frac{R_1}{R_2'} \cdot V_s'$$

Accordingly, the output voltage $V_H$ of the power source can be varied by varying the variable resistance $R_2'$.

In the circuit arrangement of FIG. 3, the negative pole of the reference power source 11' is grounded. Then, the positive pole side voltage of the reference voltage source 11' is subject to polarity inversion by a polarity inverting amplifier 17 whose voltage gain is 1 (one). The output terminal of the polarity inverting amplifier 17 is connected to the terminal 15 of the ammeter 10 through a variable resistor 14' having a resistance value $R_s'$ ($R_s' = R_2'$). The variable resistor 14' and the variable resistor 13' are changed in interlocking relationship so that both the resistance values may be held equal at all times. As a result, the correcting current equal in magnitude to the bias current $I_b$ flows through the variable resistor 14'. Almost all of the correcting current flows through the ammeter 10 is the case where the internal resistance of the ammeter 10 is sufficiently lower than the resistance $R_s'$. Therefore, the bias current $I_b$ flowing through the ammeter 10 is just canceled by the correcting current, and the ammeter 10 indicates only the true load current (emission current) $I_e$.

Figure 4:
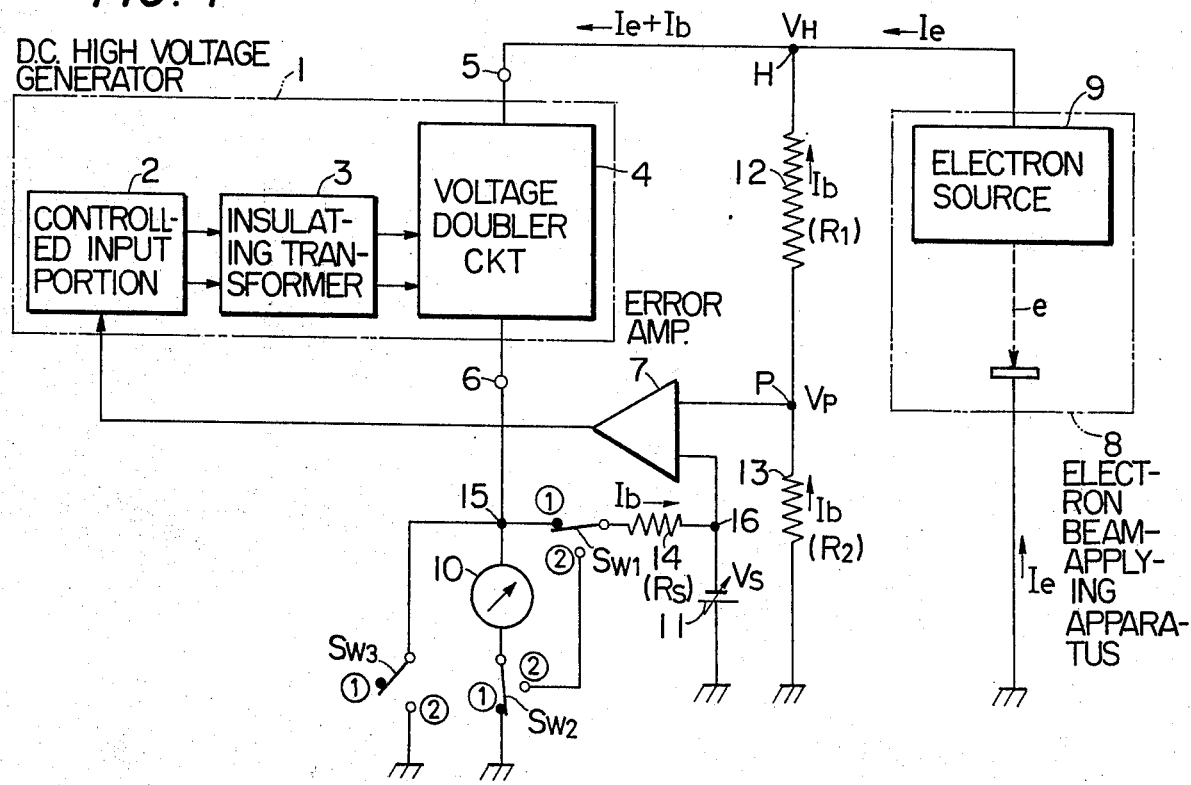
FIG. 4 is a schematic circuit diagram showing the circuit arrangement of a stabilized d.c. power source according to still another embodiment of this invention.

FIG. 4 shows still another embodiment of this invention. This embodiment is so constructed that, by switching the connection of the ammeter 10, the emission current $I_e$ and the bias current $I_b$ can be measured alternately and independently.

In FIG. 4 switches $Sw_1$, $Sw_2$, and $Sw_3$ are actuated in interlocking relationship with one another. When contact pieces of the respective switches are thrown onto side ①, as seen in the figure, the ammeter 10 indicates the emission current $I_e$, whereas when they are thrown onto side ②, the ammeter 10 indicates the bias current $I_b$. The value of the high voltage $V_H$ can be determined from the bias current $I_b$; that is, $V_H$ is evaluated as $(R_1 + R_2) \cdot I_b$.

As apparent from the foregoing detailed description, in accordance with this invention, the true load current can be determined simply and with high precision even in the case where the load cannot be floated above ground. Accordingly, the d.c. high voltage power source of this invention is especially suitable for use as a charged particle accelerating power source for a charged particle beam-applying apparatus.

Although in the foregoing embodiments reference has been made to negative d.c. high voltage power sources, it is a matter of course that his invention is also applicable to the use of positive d.c. high voltage power sources.

While I have shown and described an embodiment in accordance with the present invention, it is understood that the same is not limited thereto but is susceptible of numerous changes and modifications as known to a person skilled in the art, and I therefore do not wish to be limited to the details shown and described herein but intend to cover all such changes and modifications as are obvious to one of ordinary skill in the art.

What is claimed is:

1. A d.c. high voltage power source comprising:
 a d.c. high voltage generator having high and low voltage outputs terminals;
 voltage divider means connected to said high voltage output terminal of said generator for detecting the output voltage of said high voltage generator;
 a reference voltage source,
 error amplifier means connected to said voltage divider means and said reference voltage source for detecting an amplifying the voltage difference between the voltage detected by said voltage divider and the reference voltage derived from said reference voltage source;
 control means for controlling the output voltage of said high voltage generator in response to the output of said error amplifier so as to maintain said output of said error amplifier substantially equal to zero;
 a current measuring instrument connected between said low voltage output terminal of said d.c. high voltage generator and ground potential; and
 correcting means for applying a correcting current to said current measuring instrument having a value equal to the current flowing through said current measuring instrument due to the current of said voltage divider means.

2. A d.c. high voltage power source as defined in claim 1 wherein said correcting means is connected between said reference voltage source and said current measuring instrument.

3. A d.c. high voltage power source as defined in claim 2 wherein said voltage divider means includes plural series-connected resistors and said correcting means comprises a correcting resistor having a resistance value substantially equal to that of one of the resistors of said voltage divider means.

4. A d.c. high voltage power source as defined in claim 3 wherein said correcting means includes switch means for selectively connecting said low voltage output terminal directly to ground while connecting said measuring instrument in series with said correcting resistor to said reference voltage source.

5. A d.c. voltage power source as defined in claim 2 wherein said reference voltage source is connected in series with plural resistors of said voltage divider means, and said correcting means comprises a correcting resistor having a resistance value substantially equal to that of one of the resistors of said voltage divider means.

6. A d.c. high voltage power source as defined in claim 5 wherein said correcting means further includes a polarity inverting amplifier connected in series with said correcting resistor.

7. A d.c. high voltage power source comprising:
 a d.c. high voltage generator having high and low voltage output terminals;
 voltage divider means for detecting the output voltage of said high voltage generator, including a plurality of resistors connected in series between said high voltage output terminal of said d.c. high voltage generator and ground potential;
 an error amplifier having one input terminal connected to a voltage dividing point of said voltage divider;
 a reference voltage source connected between a second input terminal of said error amplifier and ground potential;
 control means for controlling said output voltage of said high voltage generator in response to the output of said error amplifier so as to maintain said output of said error amplifier substantially equal to zero;
 a current measuring instrument connected between said low voltage output terminal of said d.c. high voltage generator and ground potential;

a correcting resistor connected between said second input terminal of said error amplifier and said low voltage output terminal of said d.c. high voltage generator, the resistance value of said correcting resistor being substantially equal to the resistance to ground of said voltage dividing point of said voltage divider.

8. A d.c. high voltage power source as defined in claim 7 further including switch means for selectively connecting said low voltage output terminal directly to ground while connecting said measuring instrument in series with said correcting resistor between said low voltage output terminal and said second input terminal of said error amplifier.

9. A d.c. high voltage power source comprising:
a d.c. high voltage generator having high and low voltage output terminals;
a reference voltage source having one terminal grounded;
a voltage divider connected between said high voltage output terminal of said d.c. high voltage generator and the other terminal of said reference voltage source;
an error amplifier having one input terminal connected to a voltage dividing point of said voltage divider and a second input terminal grounded;
control means for controlling said output voltage of said high voltage generator in response to the output of said error amplifier so as to maintain said output of said error amplifier substantially equal to zero;
a current measuring instrument connected between said low voltage output terminal of said d.c. high voltage generator and ground potential;
means connected to said reference voltage source for inverting the polarity of the voltage derived from said other terminal of said reference voltage source;
a correcting resistor connected between the output of said polarity inverting means and said low voltage output terminal the resistance value of said resistor being equal to the resistance to ground of said voltage dividing point of said voltage divider.

10. A d.c. high voltage power source as defined in claim 9 wherein said polarity inverting means comprises a polarity inverting amplifier having one input terminal connected to said other terminal of said reference voltage source and a second input terminal connected to ground.

* * * * *